United States Patent
Yao et al.

(10) Patent No.: US 7,732,878 B2
(45) Date of Patent: Jun. 8, 2010

(54) MOS DEVICES WITH CONTINUOUS CONTACT ETCH STOP LAYER

(75) Inventors: Liang-Gi Yao, Hsinchu (TW); Shiang-Bau Wang, Taoyuan (TW); Huan-Just Lin, Hsinchu (TW); Peng-Fu Hsu, Hsinchu (TW); Jin Ying, Singapore (SG); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 11/583,634

(22) Filed: Oct. 18, 2006

(65) Prior Publication Data

US 2008/0093675 A1    Apr. 24, 2008

(51) Int. Cl.
    *H01L 29/78*    (2006.01)
(52) U.S. Cl. ............................... 257/412; 257/E29.161
(58) Field of Classification Search ................. 257/213, 257/412, 413, 288, 368, 382, 384, E29.16, 257/E29.161
    See application file for complete search history.

(56) References Cited

U.S. PATENT DOCUMENTS

| | | | | |
|---|---|---|---|---|
| 6,060,387 A | * | 5/2000 | Shepela et al. | 438/630 |
| 6,376,320 B1 | * | 4/2002 | Yu | 438/303 |
| 7,151,023 B1 | * | 12/2006 | Nayfeh et al. | 438/231 |
| 2006/0019455 A1 | * | 1/2006 | Bu et al. | 438/303 |
| 2006/0113568 A1 | * | 6/2006 | Chan et al. | 257/204 |
| 2006/0121633 A1 | * | 6/2006 | Takeoka et al. | 438/15 |
| 2006/0249794 A1 | * | 11/2006 | Teh et al. | 257/369 |
| 2007/0023845 A1 | | 2/2007 | Ohta | |

FOREIGN PATENT DOCUMENTS

| | | |
|---|---|---|
| CN | 1905209 A | 1/2007 |
| CN | 1941409 A | 4/2007 |

\* cited by examiner

*Primary Examiner*—Sue Purvis
*Assistant Examiner*—Kevin Quinto
(74) *Attorney, Agent, or Firm*—Slater & Matsil, L.L.P.

(57) ABSTRACT

A semiconductor structure includes a substrate, a gate stack on the substrate, a source/drain region adjacent the gate stack, a source/drain silicide region on the source/drain region, a protection layer on the source/drain silicide region, wherein a region over the gate stack is substantially free from the protection layer, and a contact etch stop layer (CESL) having a stress over the protection layer and extending over the gate stack.

9 Claims, 6 Drawing Sheets

MOS DEVICES WITH CONTINUOUS CONTACT ETCH STOP LAYER

TECHNICAL FIELD

This invention relates generally to the structure and manufacturing methods of metal-oxide-semiconductor (MOS) devices, and more particularly to the formation of silicide regions of MOS devices.

BACKGROUND

Deep-submicron scaling required for VLSI systems dominates design considerations in the microelectronics industry. As the length of the gate electrode is scaled down, the source and drain junctions must be scaled down accordingly to suppress the so-called short channel effects (SCE) that degrade performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing contact resistances between polysilicon gates and source/drain regions and interconnect lines is to form metal silicides atop the source/drain regions and the gate electrodes. Among the most common metal silicide materials are nickel silicide and cobalt silicide, typically formed by salicide (self-aligned silicide) processes. In a salicide process, a thin layer of metal is blanket deposited over a semiconductor wafer having exposed source/drain and gate electrode regions. The wafer is then subjected to one or more annealing steps. This annealing process causes the metal to selectively react with the exposed silicon of the source/drain regions and the gate electrode, thereby forming a metal silicide. The process is referred to as a self-aligned silicidation process because the silicide layer is formed only where the metal material directly contacts the silicon source/drain regions and the polycrystalline silicon (polysilicon) gate electrode.

In conventional silicidation processes, if gate electrodes are formed of polysilicon, silicides are also formed on the gate electrodes. Various customized designs may be performed to meet different requirements. For example, fully silicided (FUSI) gates may be formed to eliminate poly depletion effects, which are caused by polysilicon's relatively low charge-supplying ability. NMOS devices and PMOS devices may also have silicided gates with different work functions. These customized designs require that source/drain silicide regions be formed separately from the formation of gate silicide regions.

FIG. 1 illustrates a cross-sectional view in the manufacturing of a conventional MOS device. After the formation of source/drain regions 14 and source/drain silicide regions 12, a contact etch stop layer (CESL) 10 is blanket formed. In order to silicide polysilicon gate 4, a chemical mechanical polish (CMP) is performed to remove structures over polysilicon gate 4, including the portion of CESL 10 over polysilicon gate 4. Polysilicon gate 4 is then silicided using a conventional salicide process.

FIG. 2 is a top view of the structure shown in FIG. 1. It is noted that due to the CMP process, CESL 10 is separated into two portions, a portion over the source region and a portion over the drain region. This significantly reduces the stress applied by CESL 10 to the channel region of the resulting MOS device. A further problem is that since the portion of CESL 10 over polysilicon gate 4 is removed, in a subsequent process for forming contact openings in an inter-layer dielectric, there is no etch stop layer to stop the etching process. A portion of the gate silicide region, and possibly polysilicon gate 4, may be etched. This will result in the increase in contact resistance.

Accordingly, what is needed in the art is a new method and structure that may incorporate separate gate and source/drain silicide formation processes to take advantage of the benefits associated with customized gate and source/drain silicide regions while at the same time overcoming the deficiencies of the prior art.

SUMMARY OF THE INVENTION

In accordance with one aspect of the present invention, a semiconductor structure includes a substrate, a gate stack on the substrate, a source/drain region adjacent the gate stack, a source/drain silicide region on the source/drain region, a protection layer on the source/drain silicide region, wherein a region over the gate stack is substantially free from the protection layer, and a contact etch stop layer (CESL) over the protection layer.

In accordance with another aspect of the present invention, a semiconductor structure includes a substrate, a gate stack on the substrate, a gate silicide region in a top portion of the gate stack, a source region adjacent the gate stack, a source silicide region on the source region, a drain region adjacent and on an opposite side of the gate stack from the source region, a drain silicide region on the drain region wherein the source and drain silicide regions have a substantially different thickness or a substantially different composition than the gate silicide region, a protection layer on the source/drain silicide region wherein the protection layer comprises a source portion and a drain portion disconnected from each other, and a contact etch stop layer (CESL) over the protection layer and extending over the gate silicide region.

In accordance with yet another aspect of the present invention, a semiconductor structure includes a substrate and a PMOS device and an NMOS device. The PMOS device includes a first gate stack on the substrate, a first gate silicide region in a top portion of the first gate stack, a first source/drain region adjacent the first gate stack, a first source/drain silicide region on the first source/drain region, and a protection layer over the first source/drain silicide region, wherein a region over the first gate stack is substantially free from the protection layer. The NMOS device includes a second gate stack on the substrate, a second gate silicide region in a top portion of the second gate stack, wherein the first and the second gate silicide regions have substantially different compositions, a second source/drain region adjacent the second gate stack, and a second source/drain silicide region on the second source/drain region, wherein the protection layer is over the second source/drain silicide region, and wherein a region over the second gate stack is substantially free from the protection layer. The semiconductor structure further includes a contact etch stop layer (CESL) over the protection layer and the first and the second gate silicide regions.

In accordance with yet another aspect of the present invention, a method of forming a semiconductor structure includes providing a substrate, forming a gate stack on the substrate, forming a source/drain region adjacent the gate stack, forming a source/drain silicide region on the source/drain region, forming a protection layer on the source/drain silicide region, substantially removing entire portions of the protection layer over the gate stack, and forming a contact etch stop layer (CESL) having a stress over the protection layer and the gate stack.

In accordance with yet another aspect of the present invention, a method of forming a semiconductor structure includes providing a substrate, forming a gate stack on the substrate, forming a source/drain region having at least a portion in the substrate, forming a source/drain silicide region on the source/drain region, forming a protection layer on the source/drain silicide region, forming a removable layer over the protection layer and the gate stack, thinning the removable layer to expose a portion of the protection layer over the gate stack, removing the portion of the protection layer over the gate stack, reacting a gate electrode in the gate stack with a metal layer to form a silicided gate, removing the removable layer in some cases, and forming a contact etch stop layer (CESL) having a stress over the source/drain region with or without protection layer and the gate stack.

An advantageous feature of the present invention is that portions of a contact etch stop layer over a source/drain region and a gate stack region are continuous, and thus greater stress can be applied to the channel region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A metal-oxide-semiconductor (MOS) device and methods of forming the same are provided. The intermediate stages of manufacturing a preferred embodiment of the present invention are illustrated. Throughout the various views and illustrative embodiments of the present invention, like reference numbers are used to designate like elements.

Figure 1:
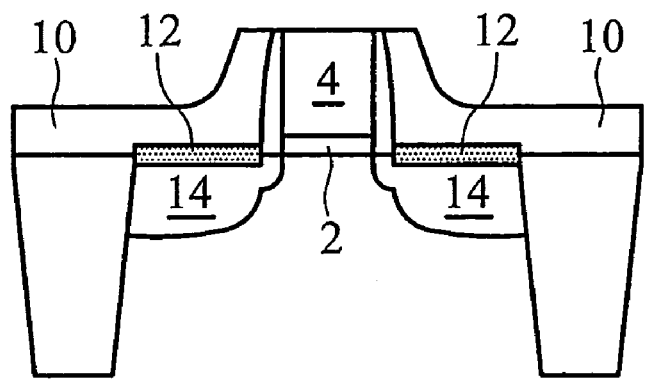
FIGS. 1 and 2 illustrate a cross-sectional view and a top view, respectively, of an intermediate stage in the manufacture of a conventional MOS device, wherein a portion of a contact etch stop layer over a gate stack is removed.
Figure 2:
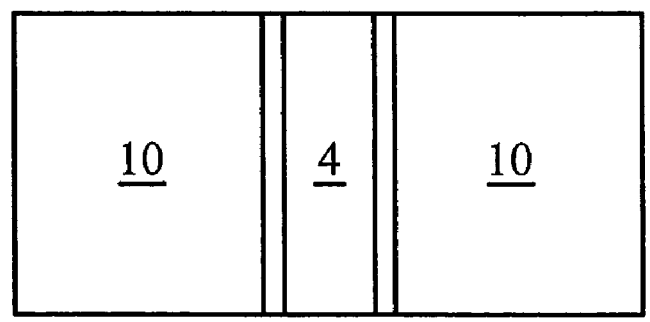
Figure 3:
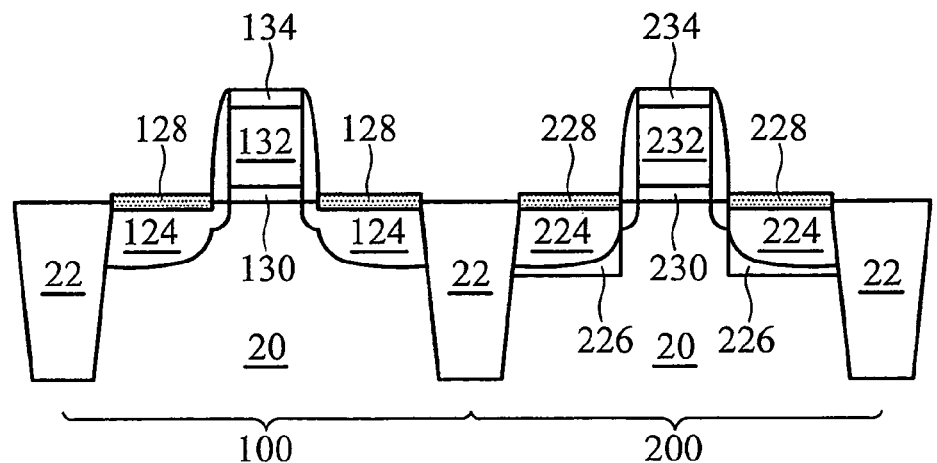
FIGS. 3 through 11 are cross-sectional views of intermediate stages in the manufacture of an embodiment of the present invention.

Referring to FIG. 3, a substrate 20 is provided, which may be formed of commonly used semiconductor materials (and structures) such as bulk silicon, silicon on insulator (SOI), SiGe, embedded SiGe (eSiGe), germanium, and the like. Shallow trench isolation regions 22 are formed in substrate 20, defining an NMOS device region 100 and a PMOS device region 200. In NMOS device region 100, a gate stack, including a gate dielectric 130, a gate electrode 132 and a mask layer 134 is formed on substrate 20. In PMOS device region 200, a gate stack, including a gate dielectric 230, a gate electrode 232 and a mask layer 234 is formed on substrate 20.

Each of the gate dielectrics 130 and 230 may be formed of commonly used dielectric materials, such as oxides, high-k dielectric materials, nitrides, oxynitrides, and combinations thereof, and the appropriate material depends on the design requirement. In the preferred embodiment, gate electrodes 132 and 232 are formed of polysilicon or polysilicon with thin metal films, and polysilicon may be doped with n-type and p-type impurities, respectively. Alternatively, gate electrodes 132 and 232 may be formed of metals. Mask layers 134 and 234 are preferably formed of dielectric materials, such as silicon nitride, silicon oxynitride, silicon carbide, and the like.

Source/drain regions 124 and 224 are formed in NMOS device region 100 and PMOS device region 200, respectively. In PMOS region 200, SiGe stressors 226 may be formed, which apply a compressive stress to the channel region of the respective PMOS device. Silicide regions 128 are formed on source/drain regions 124, and silicide regions 228 are formed on source/drain regions 224. In the preferred embodiment, silicide regions 128 and 228 comprise metals that react with silicon or SiGe at low temperatures, such as nickel, Ni—Yb, Ni—Pt, and the like. However, other metals, such as cobalt, platinum, manganese, palladium, and the like, can also be used. Silicide regions 128 and 228 may be formed separately and may comprise different metals.

Figure 4:
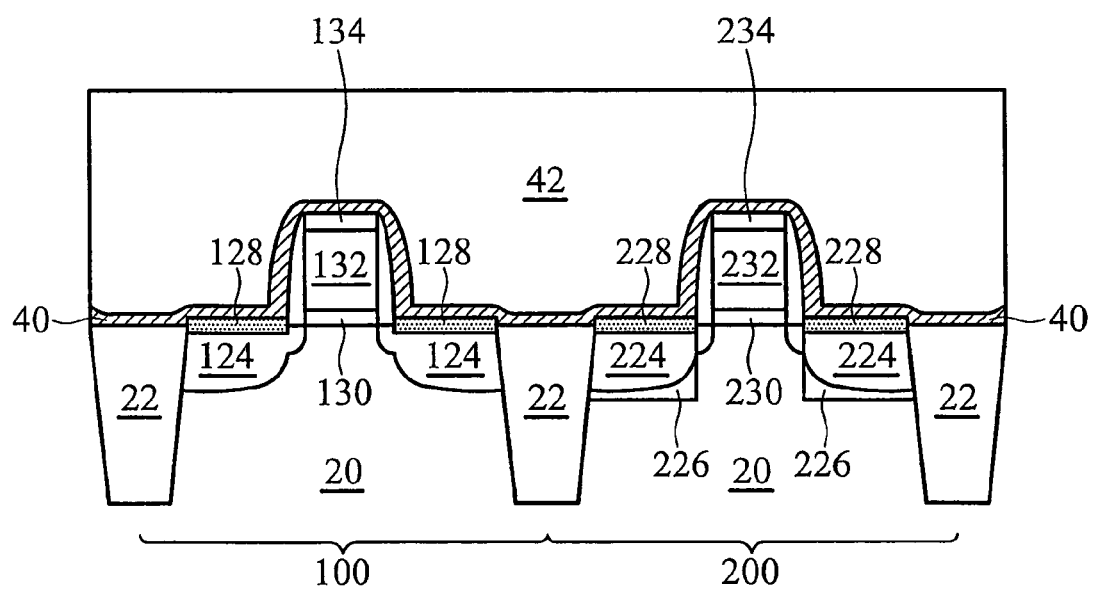

Referring to FIG. 4, a protection layer 40 is blanket formed to cover device regions 100 and 200. Protection layer 40 is preferably a thin layer, so that there is a lesser adverse effect on the strain applied to the channel region by the subsequently formed contact etch stop layer. In the preferred embodiment, the thickness of protection layer 40 is less than about 400 Å, and more preferably less than about 200 Å. Protection layer 40 may include oxides, nitrides, oxynitrides, combinations thereof, and multi-layers thereof.

FIG. 4 also illustrates a removable layer 42 formed on protection layer 40. In the preferred embodiment, removable layer 42 is a photo resist. In other embodiments, removable layer 42 comprises spin-on glass (SOG). In yet other embodiments, removable layer 42 comprises dielectric materials formed using chemical vapor deposition (CVD) methods, such as plasma enhanced CVD (PECVD), selective area CVD (SACVD), and the like. Preferably, removable layer 42 has different etching characteristics than protection layer 40.

Figure 5:
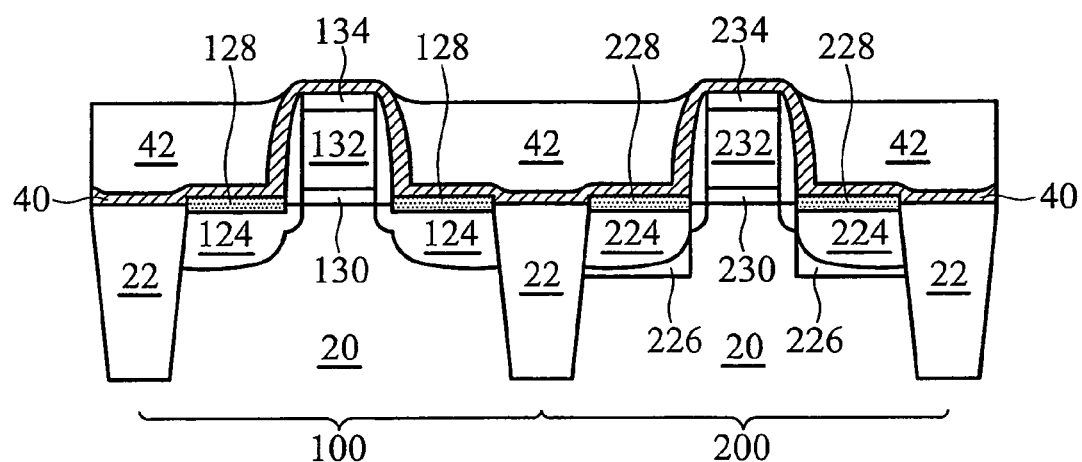

In FIG. 5, removable layer 42 is thinned to expose a top portion of protection layer 40. The thinning of removable layer 42 may be performed using chemical mechanical polish (CMP) or etching, which includes either dry etching or wet etching. After the etching or CMP, portions of removable layer 42 still remain to protect the underlying protection layer 40.

Figure 6:
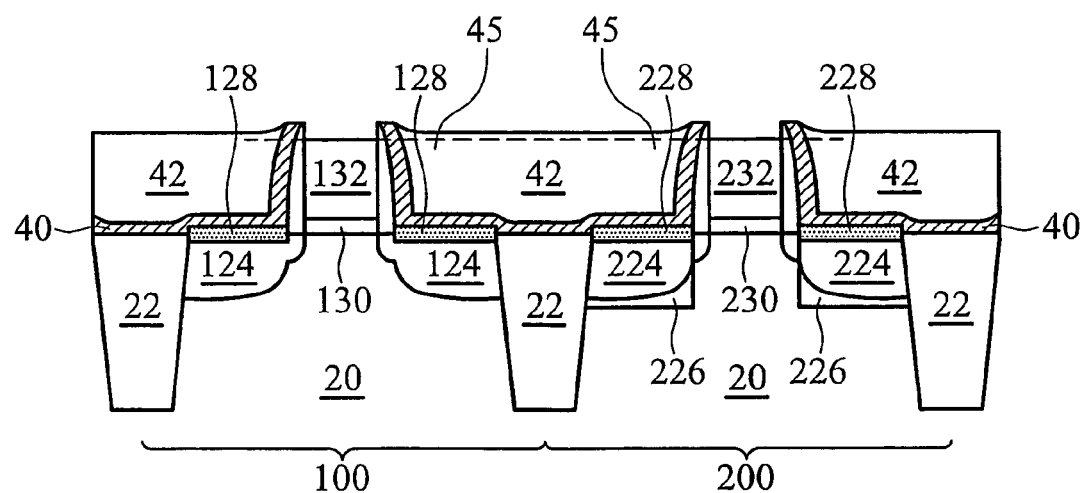

FIG. 6 illustrates the exposure of gate electrodes 132 and 232. The exposed portion of protection layer 40 is removed, preferably using wet or dry etching. Mask layers 134 and 234 are then removed, and underlying gate electrodes 132 and 232 are exposed.

In an alternative embodiment, after the deposition of removable layer 42, a CMP is performed. The CMP process stops once gate electrodes 132 and/or 232 are exposed. In a resulting structure, portions of gate spacers on sidewalls of gate electrodes 132 and 232 and protection layer 40 over dotted line 45 are removed.

Figure 7A:
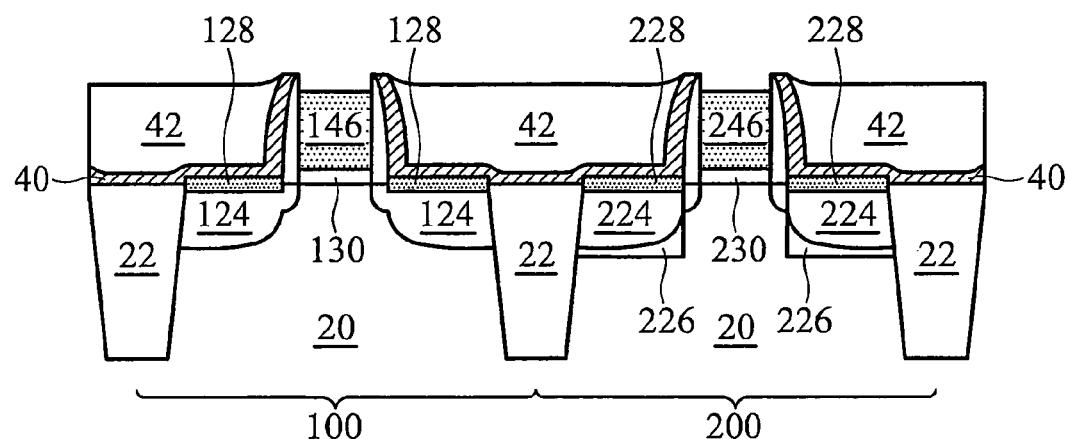
Figure 7B:
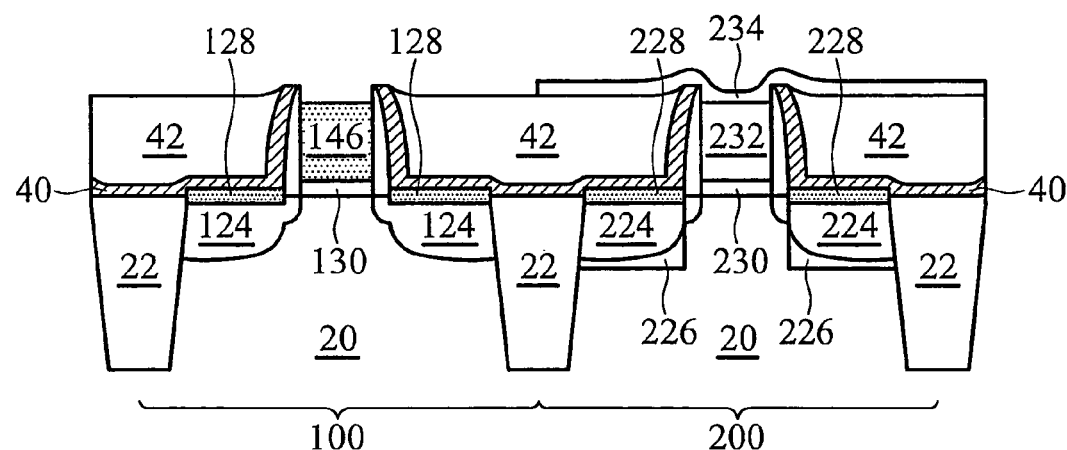

FIGS. 7A and 7B illustrate the formation of gate silicide regions 146 and 246, which may be fully silicided (FUSI) gates. As is known in the art, to form silicide regions, a metal layer (not shown) is formed on gate electrodes 132 and 232 (refer to FIG. 6). An annealing is then performed to cause a reaction between the metal layer and the underlying silicon/SiGe. Un-reacted metal is then removed by using a chemical that attacks un-reacted metal, but not metal silicide. In one embodiment, a same metal layer (not shown) is formed on gate electrodes 132 and 232. As a result, as illustrated in FIG. 7A, the resulting silicided gate electrodes 146 and 246 comprise same silicides. In other embodiments, as shown in FIG.

7B, different metals are deposited on gate electrodes 132 and 232, and thus the resulting gate silicides 146 and 246 have different compositions. In an exemplary embodiment, a mask 248 is formed to protect one of the gate electrodes 132 and 232, such as gate electrode 232, and gate electrode 132 is silicided to form silicided gate 146. Mask 248 is then removed. Similarly, another mask (not shown) may be formed to protect silicided gate 146, and gate electrode 232 is silicided to form silicided gate 246. The resulting structure is similar to what is shown in FIG. 7A. In this embodiment, silicided gates 146 and 246 may comprise different metals, which preferably have different work functions.

The embodiments of the present invention are useful for forming MOS devices whose gate silicide region and source/drain silicide regions have different compositions, wherein "different composition" means that metal layers used for forming the source/drain silicide regions or the gate silicide regions comprise at least one different metallic element from each other. The term "different composition" may also be used to refer to substantially different percentages of the metallic elements in the gate silicide regions and the source/drain silicide regions, even if the types of metallic elements in the metal layers are substantially the same. For example, if one metal element in the gate silicide regions and source/drain regions has a substantial percentage difference such as greater than about 5 percent, the compositions are considered to be different. The embodiments of the present invention are also useful for forming gate silicide regions and respective source/drain silicide regions that have substantially different thicknesses. For example, a FUSI gate silicide may have a greater thickness than a source/drain silicide region.

Figure 8:
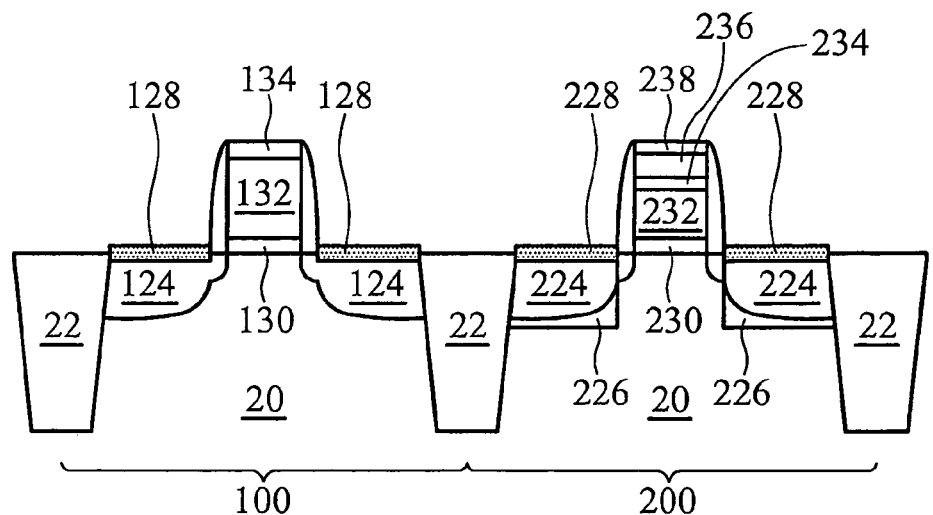
Figure 9:
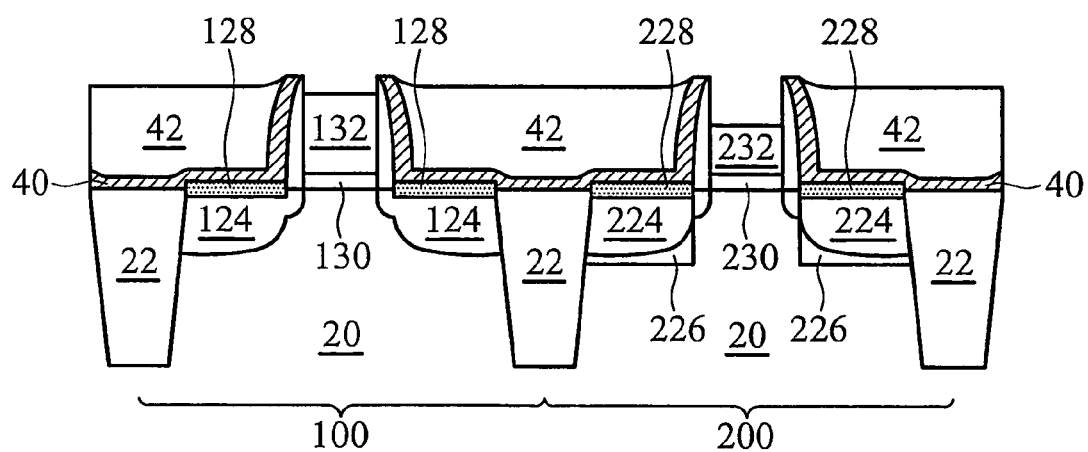

FIGS. 8 and 9 illustrate an alternative embodiment of the present invention. FIG. 8 is similar to FIG. 3, except one of the gate stacks, for example, the gate stack in device region 200, further includes an additional polysilicon layer 236 and an additional mask layer 238. Accordingly, gate electrode 232 has smaller thickness, which may be, for example, only one half of the thickness of gate electrode 132. Due to the different thicknesses of gate electrodes 132 and 232, the resulting silicided gates 146 and 246 will have different compositions, even though a same metal is used for the formation of silicides. The thicknesses of silicided gates 146 and 246 will also be different. In an exemplary embodiment, after process steps as shown in FIGS. 4 through 6 are performed, a structure as shown in FIG. 9 is formed by removing layers 134, 238, 236 and 234. In the subsequent silicide formation process, since gate electrode 232 has a thickness of less than the thickness of gate electrode 132, the resulting gate silicide regions have different compositions. For example, when nickel silicide is formed, silicided gate 146 may comprise NiSi, while silicided gate 246 (refer to FIG. 7A) may comprise $Ni_2Si$. By modifying the thicknesses of gate electrodes 132 and 232 (refer to FIG. 3) and the metals used for forming silicided gates 146 and 246, different combinations of silicided gates 146 and 246 may be formed.

In the embodiments discussed in the preceding paragraphs, gate silicide regions are formed by siliciding the gate electrodes 132 and 232. In alternative embodiments, gate electrodes 132 and 232 may be etched away, and conductive materials filled into the openings left by gate electrodes 132 and 232. The conductive materials may include metals, metal silicides, metal nitrides, and the like.

Figure 10:
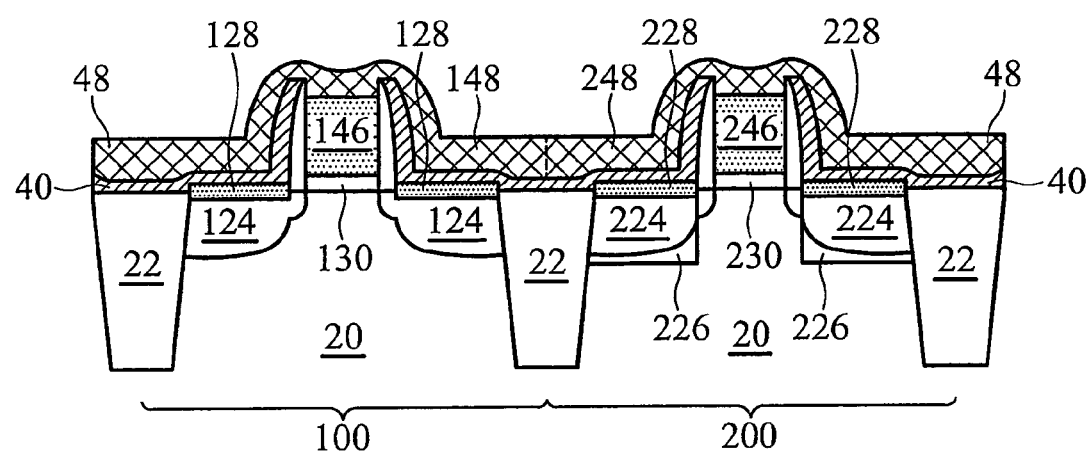

FIG. 10 illustrates the formation of a contact etch stop layer (CESL) 48, which may comprise commonly used dielectric materials, such as silicon nitride, silicon oxynitride, silicon oxycarbide, silicon carbide, combinations thereof, and multi-layers thereof. Besides stopping an etching process, CESL 48 also applies a stress to the channel regions of the respective MOS devices. Preferably, CESL portion 148, which is in NMOS device region 100, has a tensile stress, while CESL portion 248, which is in PMOS device region 200, has a compressive stress. As is known in the art, to efficiently supply stresses to the channel regions of the respective MOS devices, CESL 48 is preferably closely located to the channel regions. Accordingly, the thickness of protection layer 40 is preferably small.

Figure 11:
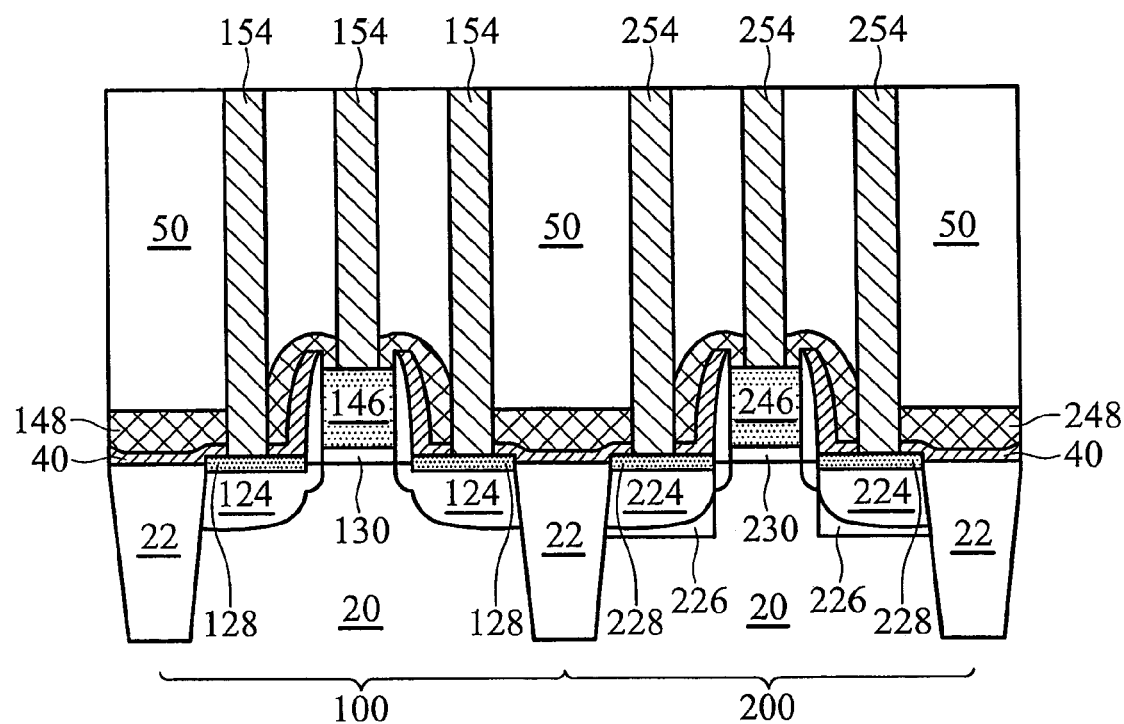

Next, as illustrated in FIG. 11, an inter-layer dielectric (ILD) 50 is deposited over CESL 48. ILD 50 is preferably a low-k dielectric layer having a low dielectric constant, for example, less than about 3.5. Contact openings (not shown) are then formed by etching ILD 50. With the help of CESL 48, the etching of ILD 50 is more precisely controlled. CESL 48 and protection layer 40 in the contact openings are also removed, exposing the underlying silicided gates and source/drain silicide regions. Next, a metallic material, which preferably includes tungsten, titanium, aluminum, copper, and combinations thereof, is filled into the contact openings, forming contact plugs 154 and 254. In the resulting structure, CESL 48 may include gate portions directly over silicided gates 146 and 246, but not directly over protection layer 40, and contact plugs 154 and 254 may be in physical contact with CESL 48, but not with protection layer 40. Further, CESL 48 may be in physical contact with the underlying silicided gates 146 and 246, respectively.

Although the present invention and its advantages have been described in details, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a gate stack on the substrate;
   a gate silicide region in a top portion of the gate stack;
   a source region adjacent the gate stack;
   a source silicide region on the source region;
   a drain region adjacent and on an opposite side of the gate stack from the source region;
   a drain silicide region on the drain region, wherein the source and drain silicide regions have a substantially different thickness or a substantially different composition from the gate silicide region;
   a protection layer on the source and drain silicide regions, wherein the protection layer comprises a source portion directly over the source region, and a drain portion directly over the drain region;
   a contact etch stop layer (CESL) over the protection layer and extending over the gate silicide region; and a contact plug extending from over the CESL into the CESL, wherein the contact plug is in physical contact with the CESL, and not in physical contact with the protection layer.

2. The semiconductor structure of claim 1, wherein the CESL comprises a source portion and a drain portion, and wherein the source portion and the drain portion of the CESL are connected through a portion of the CESL over the gate silicide region.

3. The semiconductor structure of claim 1, wherein the gate silicide region extends to a gate dielectric in the gate stack.

4. The semiconductor structure of claim 1, wherein the protection layer comprises a portion extending on a sidewall of a gate spacer, and wherein the gate spacer is on a sidewall of the gate stack.

5. The semiconductor structure of claim 4, wherein the gate spacer has a top surface, and wherein a region over the top surface of the gate spacer is free from the protection layer.

6. The semiconductor structure of claim 1, wherein the protection layer comprises a material selected from the group consisting essentially of an oxide, a nitride, an oxynitride, and combinations thereof.

7. A semiconductor structure comprising:
a substrate;
a PMOS device comprising:
 a first gate stack on the substrate;
 a first gate silicide region in a top portion of the first gate stack;
 a first source/drain region adjacent the first gate stack;
 a first source/drain silicide region on the first source/drain region;
 a first gate spacer on a sidewall of the first gate stack; and
 a protection layer over the first source/drain silicide region, wherein the region over the first gate stack is substantially free from the protection layer;
an NMOS device comprising:
 a second gate stack on the substrate;
 a second gate spacer on a sidewall of the second gate stack, wherein a top surface of the protection layer is substantially leveled to a top surface of the first gate spacer and the second gate spacer;
 a second gate silicide region in a top portion of the second gate stack, wherein the first and the second gate silicide regions have substantially different compositions;
 a second source/drain region adjacent the second gate stack; and
 a second source/drain silicide region on the second source/drain region, wherein the protection layer is over the second source/drain silicide region, and wherein the region over the second gate stack is substantially free from the protection layer; and
a contact etch stop layer (CESL) over the protection layer and the first and the second gate silicide regions.

8. The semiconductor structure of claim 7, wherein at least one of the first source/drain silicide region and the second source/drain silicide region has a different composition from the first gate silicide region and the second gate silicide region, respectively.

9. The semiconductor structure of claim 7, wherein at least one of the first source/drain silicide region and the second source/drain silicide region has a different thickness from the first gate silicide region and the second gate silicide region, respectively.

* * * * *